(12) United States Patent
Sterrantino et al.

(10) Patent No.: US 6,515,524 B1
(45) Date of Patent: Feb. 4, 2003

(54) POWER-UP CONTROL CIRCUIT

(75) Inventors: Scott Sterrantino, Allen, TX (US);
Jian Zhou, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/903,348

(22) Filed: Jul. 11, 2001

(51) Int. Cl.[7] ................................. H03L 7/00
(52) U.S. Cl. ..................................... 327/143
(58) Field of Search ............... 327/141, 143, 327/198

(56) References Cited

U.S. PATENT DOCUMENTS 6,362,669 B1 * 3/2002 Zhou et al. ................ 327/143

* cited by examiner

Primary Examiner—Dinh T. Le
(74) Attorney, Agent, or Firm—William B. Kempler; W. James Brady; Frederick J. Telecky, Jr.

(57) ABSTRACT

A power-up control circuit architecture that utilizes zero current under normal operation. The power-up control circuit will sense a common supply voltage, Vcc, and turn an output on and off at a desired threshold voltage, providing a substantially faster on/off switch than that achievable solely by sensing the common supply voltage.

7 Claims, 1 Drawing Sheet

POWER-UP CONTROL CIRCUIT

BACKGROUND OF THE INVENTION

1. Field of the Invention

This invention relates generally to power-up control circuits, and more particularly to a power-up control circuit having an architecture that senses a rising and falling supply voltage while consuming no current during normal operation.

2. Description of the Prior Art

Circuits, products and processes that presently employ one or more dedicated power-up control circuits are problematic in that once the circuit(s), product(s) and/or process (es) become fully operational following the initial power-up, current continues to be consumed, and therefore wasted, by the one or more dedicated power-up control circuits. These known power-up circuit solutions and architectures require current flow throughout the power-up circuit(s) at any time the associated circuit, product, or process is in operation; and are limited in that there is presently no power-up circuit solution that requires no current during normal operation while still being able to sense a falling supply voltage.

In view of the foregoing, a need exists for a power-up control circuit that requires no current during normal operation while maintaining sense on the supply voltage, regardless of whether the supply voltage is rising or falling.

SUMMARY OF THE INVENTION

The present invention is directed to a power-up control circuit architecture that utilizes zero current under normal operation. The power-up control circuit will sense a common supply voltage, Vcc, and turn an output on and off at a desired threshold voltage, providing a substantially faster on/off switch than that achievable solely by sensing the common supply voltage.

BRIEF DESCRIPTION OF THE DRAWINGS

Other aspects, features and advantages of the present invention will be readily appreciated as the invention becomes better understood by reference to the following detailed description when considered in connection with the accompanying drawing figure wherein.

Figure 1:
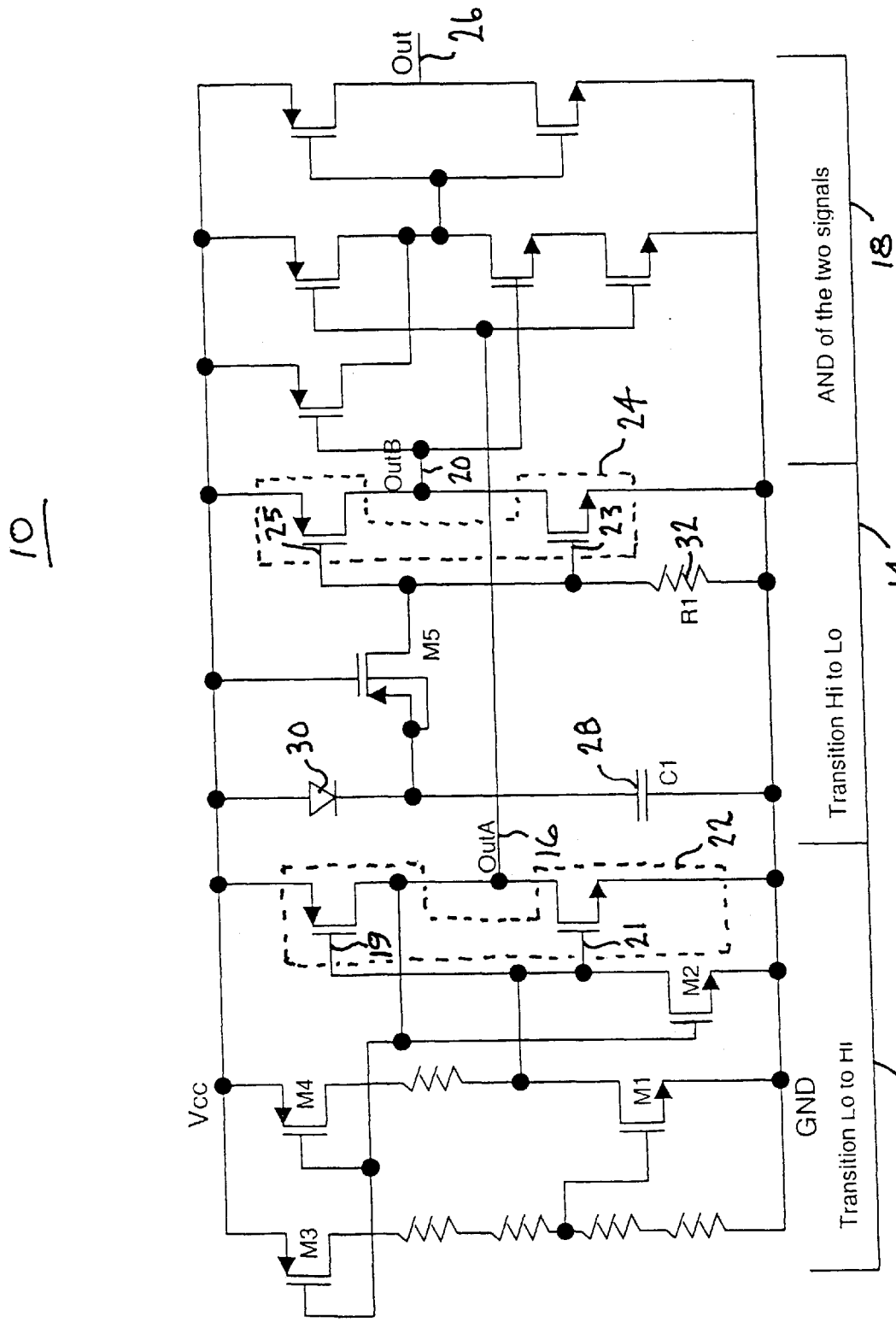
FIG. 1 is a schematic diagram illustrating a power-up control circuit according to one embodiment of the present invention.

While the above-identified drawing figure sets forth a particular embodiment, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

FIG. 1 is a schematic diagram illustrating a power-up control circuit 10 according to one embodiment of the present invention. Power-up control circuit 10 can be seen connected to a common supply voltage, Vcc, as well as a common ground, GND. Power-up control circuit 10 has two main sections, including a first section 12 that controls the low-to-high common supply voltage transition, and a second section 14 that controls the high-to-low common supply voltage transition. The output signal (OutA) 16 of the first section 12 is combined in a third section 18 with the output signal (OutB) 20 of the second section. The third section 18 comprises a logic AND function for the output signals 16, 20 produced by the first section 12 and the second section 14.

Theory of Operation

When the common supply voltage, Vcc, is low, output signal (OutA) 16 is low, transistors M3 and M4 are on, and transistors M1 and M2 are off. As the common supply voltage, Vcc, starts to rise, signal OutA 16 remains low due to the pull-up of transistor M4 at the gates 19, 21 of inverter 22. When a sufficient turn-on voltage is reached at the gate of transistor M1, transistor M1 will turn on and pull-down the gates 19, 21 of the inverter 22, causing the output signal at OutA 16 to be pulled high. The output signal at OutB 20 is already high due to the pulldown resistor R1 (32) at the gates 23, 25 of its associated inverter 24, causing the output signal at Out 26 to pull high. After the signal at OutA 16 has transitioned high, it will turn off transistors M3 and M4 and turn on transistor M2, removing all current flow such that the signal at OutA 16 will be held in a high state.

As the common supply voltage, Vcc, stays high, capacitor C1 (28) is being charged to Vcc-Vdiode, wherein Vdiode is provided by diode 30. At this time, transistor M5 is off. As Vcc starts its transition downward, capacitor 28 remains charged, and transistor M5 stays off until Vcc goes low enough to turn on transistor M5. When transistor M5 turns on, capacitor 28 discharges into pulldown resistor 32, and for a sufficiently large pulldown resistance value, bumps up the voltage at the gates 23, 25 of inverter 24. The gates 23, 25 to the inverter 24 associated with OutB 20 then go high, causing the signal at OutB to transition low. The action will pull the output signal at Out 26 low. As Vcc continues dropping to zero, the signal at OutA 16 will also drop to zero, turning on transistors M3 and M4 and turning off transistor M2, placing the power-up control circuit 10 back into its initial condition.

In view of the above, it can be seen the present invention presents a significant advancement in the art of power-up control circuits. Further, this invention has been described in considerable detail in order to provide those skilled in the power-up control circuit art with the information needed to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A power-up control circuit comprising:
    a first sensing circuit configured to sense a low-to-high supply voltage transition and further configured to generate a first output signal when the supply voltage reaches a desired level;
    a second sensing circuit configured to sense a high-to-low supply voltage transition and further configured to generate a second output signal when the supply voltage reaches a desired level; and
    a logic circuit configured to sense high and low signal states associated with the first output signal and the second output signal and further configured to generate a power-up control circuit output signal that is dependent upon the signal states, such that when the supply voltage reaches a steady-state condition, the power-up control circuit draws substantially no current.

2. The power-up control circuit according to claim 1 wherein the logic circuit is configured as an AND circuit.

3. A power-up control circuit comprising:

first sensing means for sensing a low-to-high supply voltage transition to generate a first output signal when the supply voltage reaches a desired level;

second sensing means for sensing a high-to-low supply voltage transition to generate a second output signal when the supply voltage reaches a desired level; and third sensing means for sensing high and low signal states associated with the first output signal and the second output signal to generate a power-up control circuit output signal that is dependent upon the signal states, such that when the supply voltage reaches a steady-state condition, the power-up control circuit draws substantially no current.

4. The power-up control circuit according to claim 3 wherein the third sensing means comprises an AND logic circuit.

5. A power-up control circuit comprising first means operational to sense a low-to-high supply voltage transition and generate a first output signal when the supply voltage reaches a desired level, and second means operational to sense a high-to-low supply voltage transition and generate a second output signal when the supply voltage reaches a desired level, third means for combining the first and second output signals to generate a power-up control circuit output signal that is dependent upon the first and second output signals, and wherein the power-up control circuit draws substantially zero current when the power-up control circuit reaches a steady state condition.

6. A power-up control circuit comprising:

a first inverter circuit;

a first switching circuit configured to sense a low-to-high supply voltage transition and cause the first inverter circuit to generate a first output signal when the supply voltage reaches a desired level;

a second inverter circuit;

a second switching circuit configured to sense a high-to-low supply voltage transition and cause the second inverter circuit to generate a second output signal when the supply voltage reaches a desired level; and a logic circuit responsive to the first and second output signals to generate a power-up control circuit output signal, wherein the power-up control circuit draws substantially zero current when the supply voltage reaches a steady state condition.

7. The power-up control circuit according to claim 6 wherein the logic circuit comprises an AND gate.

* * * * *